(12) United States Patent
Livellara et al.

(10) Patent No.: US 10,141,422 B2
(45) Date of Patent: Nov. 27, 2018

(54) METHOD OF MANUFACTURING A SEMICONDUCTOR DEVICE INTEGRATING A VERTICAL CONDUCTION TRANSISTOR, AND SEMICONDUCTOR DEVICE

(71) Applicant: STMICROELECTRONICS S.R.L., Agrate Brianza (IT)

(72) Inventors: Luisito Livellara, Cernusco sul Naviglio (IT); Paolo Colpani, Agrate Brianza (IT); Pierpaolo Monge Roffarello, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/595,256

(22) Filed: May 15, 2017

(65) Prior Publication Data

US 2018/0182864 A1 Jun. 28, 2018

(30) Foreign Application Priority Data

Dec. 22, 2016 (IT) .................. 102016000130185

(51) Int. Cl.
*H01L 29/76* (2006.01)
*H01L 29/66* (2006.01)
(Continued)

(52) U.S. Cl.
CPC .. *H01L 29/66734* (2013.01); *H01L 21/02381* (2013.01); *H01L 21/02532* (2013.01);
(Continued)

(58) Field of Classification Search
CPC ............... H01L 29/4236; H01L 29/407; H01L 29/7827; H01L 29/7811; H01L 29/66666;
(Continued)

(56) References Cited

U.S. PATENT DOCUMENTS 3,730,765 A 5/1973 Stein
4,274,891 A 6/1981 Silvestri et al.
(Continued)

FOREIGN PATENT DOCUMENTS

GB 2037487 A 7/1980

OTHER PUBLICATIONS

Kamins, T.I. et al., "Diffusion of Impurities in Polycrystalline Silicon," J. Appl. Phys. 43(1):83-91, Jan. 1972.
(Continued)

*Primary Examiner* — Theresa T Doan
(74) *Attorney, Agent, or Firm* — Seed IP Law Group LLP

(57) ABSTRACT

A method of manufacturing a vertical conduction semiconductor device comprising the steps of: forming a recess in a monocrystalline silicon substrate; forming a silicon oxide seed layer in the recess; carrying out an epitaxial growth of silicon on the substrate, simultaneously growing a polycrystalline silicon region in the seed layer and a monocrystalline silicon region in surface regions of the substrate, which surround the seed layer; and implanting dopant species in the polycrystalline silicon region to form a conductive path in order to render the second conduction terminal electrically accessible from a front side of the vertical conduction semiconductor device.

16 Claims, 5 Drawing Sheets

(51) Int. Cl.
*H01L 21/02* (2006.01)
*H01L 21/74* (2006.01)
*H01L 29/78* (2006.01)
*H01L 29/40* (2006.01)
*H01L 29/423* (2006.01)
*H01L 21/48* (2006.01)

(52) U.S. Cl.
CPC .. *H01L 21/02639* (2013.01); *H01L 21/02645* (2013.01); *H01L 21/48* (2013.01); *H01L 21/743* (2013.01); *H01L 29/401* (2013.01); *H01L 29/4236* (2013.01); *H01L 29/7802* (2013.01); *H01L 29/7809* (2013.01)

(58) Field of Classification Search
CPC ............... H01L 29/7802; H01L 29/402; H01L 29/66712; H01L 29/401
USPC .......................................................... 257/330
See application file for complete search history.

(56) References Cited

U.S. PATENT DOCUMENTS

| | | |
|---|---|---|
| 4,949,146 A | 8/1990 | Herzog et al. |
| 6,198,114 B1 | 3/2001 | Blanchard |
| 2004/0021233 A1 | 2/2004 | Kinzer et al. |
| 2007/0023793 A1* | 2/2007 | Yamaguchi ......... H01L 29/7813 257/288 |
| 2008/0283909 A1* | 11/2008 | Akiyama ............ H01L 29/1095 257/330 |

OTHER PUBLICATIONS

Korvink, J. G. et al. (2006) *MEMS: A Practical Guide to Design, Analysis, and Applications*, Chapter 15, Norwich, NY: William Andrew, Inc., 85 pgs.

* cited by examiner

METHOD OF MANUFACTURING A SEMICONDUCTOR DEVICE INTEGRATING A VERTICAL CONDUCTION TRANSISTOR, AND SEMICONDUCTOR DEVICE

BACKGROUND

Technical Field

The present disclosure relates to a method of manufacturing a semiconductor device integrating a vertical conduction transistor, and to a vertical conduction device.

Description of the Related Art

As is known, the term "vertical trench MOS" (VTMOS) is generally used to define an architecture for power devices capable of sustaining high voltages. Reference may be made, for example, to FIG. 1, which is a schematic illustration of a portion of a die 1 that integrates a VTMOS device 3, according to an embodiment of a known type. One or more control (gate) regions 5 of the VTMOS extend in depth in a semiconductor body 2 of monocrystalline silicon, enabling, in use, formation of a vertical conductive channel 4 (in which the currents i' and i" flow). For this purpose, source regions 7 and drain regions 9 are formed in respective opposite surfaces 2a, 2b of the semiconductor body 2. The drain region 9 is a doped region formed on the surface 2b of the semiconductor body 2. An implanted region extends in monocrystalline regions of the semiconductor body 2 between the surfaces 2a and 2b, in electrical contact with the drain region 9, to form a conductive path 8 that will enable electrical contact of the drain terminal on the surface 2a. In this way, the VTMOS device 3 has the electrical contact terminals of gate G, source S, and drain D on a same surface 2a, thus simplifying the contacting steps (which may be performed, for example, via wire bonding).

The portion of the die 1 formed in which, in use, is the vertical conductive channel 4 is an active area of the VTMOS device 3. Present between the conductive path 8 and the active area is a field-plate trench 6, which extends, in a known way, in depth in the semiconductor body 2.

The conductive path 8 is formed by implantation and subsequent thermal diffusion of dopant species and extends alongside, and outside, the active area of the VTMOS device. The conductive path 8 is a low-resistance path and is typically referred to as "drain sinker region".

The semiconductor body 2 typically comprises a semiconductor substrate, made, for example, of monocrystalline silicon, extending over which is an epitaxial layer having a thickness of several microns (e.g., 3-6 μm). The conductive path 8 extends in the epitaxial layer, throughout the thickness thereof, whereas the drain region 9 extends substantially at the interface between the substrate and the epitaxial layer.

According to the thickness of the epitaxial layer, the conductive path 8 is obtained by one or more consecutive implantations carried out with respective implantation energies so as to reach the drain region 9 in order to form an electrical contact therewith. However, for large thicknesses of the epitaxial layer 2, in particular greater than 3-4 μm, the implanted region could find some difficulty in reaching, or not reach at all, the drain region 9. The consequence of this is formation of a conductive path 8 with high resistivity (even equal to 30% of the ON-state resistance $R_{ON}$ of the VTMOS 3).

UK Patent Publication No. GB 2037487, filed in the name of SGS-ATES COMPONENTI ELETTRONICI S.P.A., describes a method of manufacturing a collector deep diffusion (sinker) of polycrystalline silicon, where the polycrystal is deemed a means for obtaining fast diffusion of dopant species. For this purpose, a polycrystalline silicon column is grown on a monocrystalline silicon substrate that has a polycrystalline silicon seed. During the process of growth, there is noted formation of a column (having a substantially trapezial shape) around the polycrystalline silicon seed, and formation of monocrystalline silicon in the remaining substrate portions. A transition zone is present between the polycrystalline silicon column and the monocrystalline region. The embodiment taught by GB 2037487 presents, however, some disadvantages. The temperatures used for growth of the epitaxial layer, between 700° C. and 800° C., are not adequate for the growth of thick layers (e.g., between 5 and 10 μm) in times compatible with high production volumes. For instance, to guarantee the growth of an epitaxial layer having a thickness adequate to sustain operating voltages of several tens of volts (e.g., having a thickness of approximately 6 μm) in times compatible with high production volumes, it would be necessary to use temperatures of growth higher than 1100° C. In these temperature conditions, however, the polysilicon seed would not lead to formation of a polysilicon column, but of a highly defective monocrystalline silicon region, which is undesired for the purposes of the present disclosure. Furthermore, the present applicant has found that the embodiment taught by GB 2037487 leads to formation of a deflected area on the top surface, caused by the different rate of growth of the polysilicon column on the polysilicon seed and on the monocrystalline silicon that surrounds it.

BRIEF SUMMARY

According to the present disclosure a method of manufacturing a semiconductor device integrating a vertical conduction transistor and a vertical conduction device are provided.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 2:
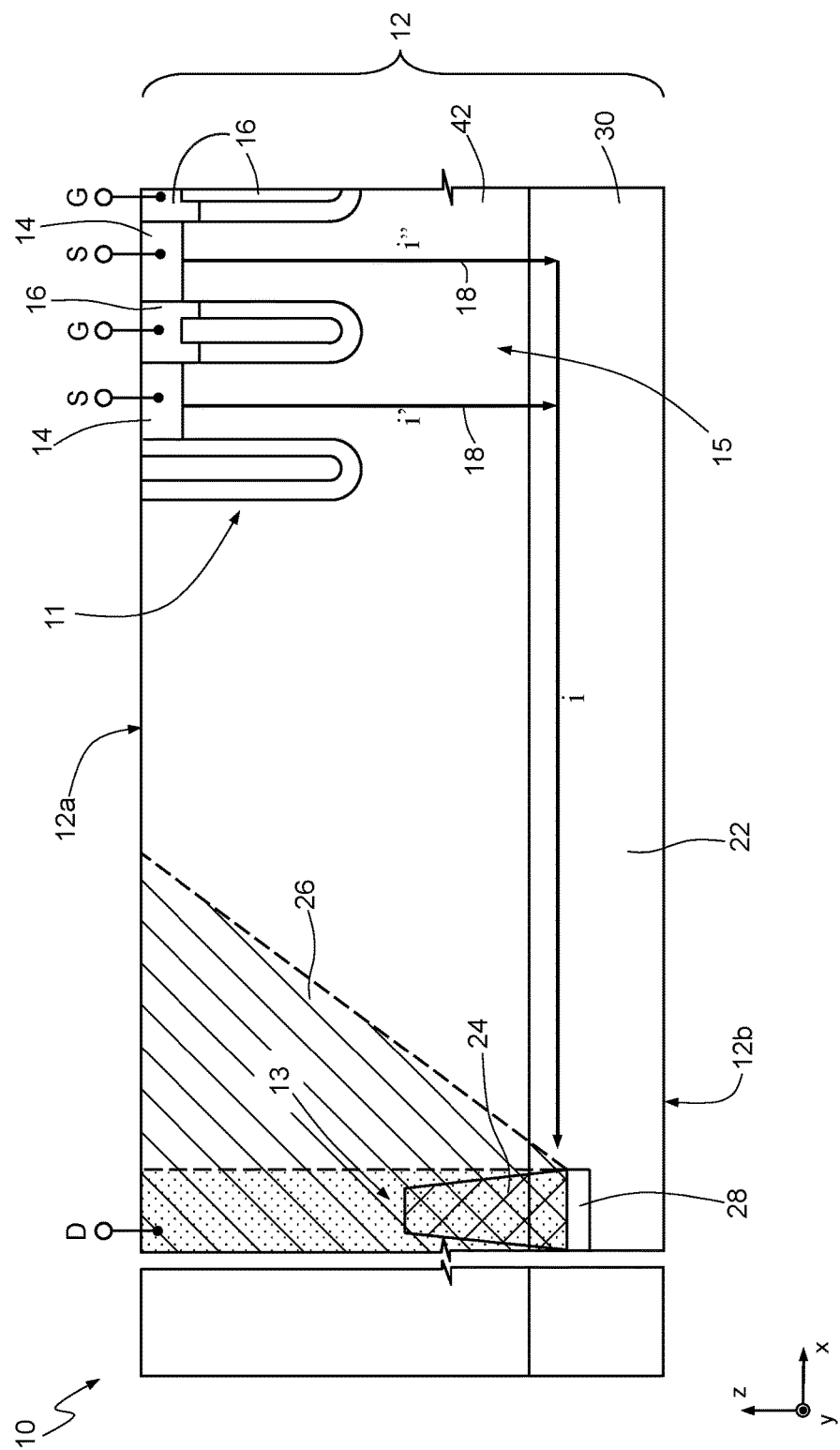
FIG. 2 shows, in lateral-sectional view, a portion of a vertical conduction device according to an embodiment of the present disclosure.

FIG. 2 illustrates a portion of a die 10 that integrates a vertical channel electronic device 11 (e.g., a VTMOS), made in a semiconductor body 12, according to an aspect of the present disclosure.

Figure 1:
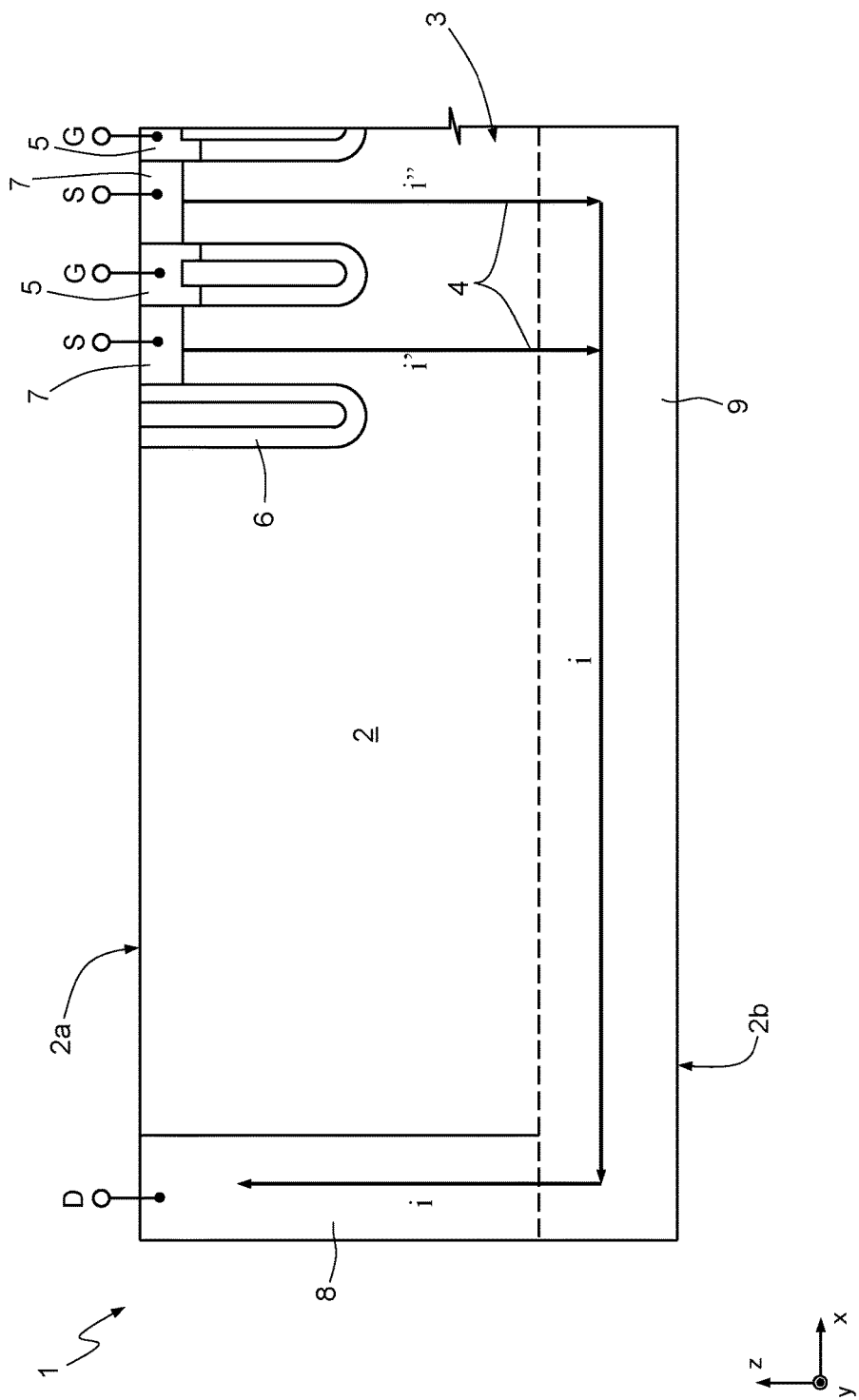
FIG. 1 shows, in lateral-sectional view, a portion of a VTMOS device according to an embodiment of a known type.

In particular, one aspect of the present disclosure regards a method of obtaining a drain sinker (i.e., a deep diffusion region) 13 alternative to the one illustrated in FIG. 1 and designated by the reference number 8, which has been described previously. More in particular, according to one aspect of the present disclosure, production of the drain sinker includes forming a polycrystal region in which the diffusion of dopant species is faster and enables a diffusion profile to be obtained that is more uniform than what occurs in the monocrystalline silicon. According to a further aspect of the present disclosure, the polycrystal region is grown simultaneously with epitaxial growth of monocrystalline regions in which, in subsequent processing steps, active-area regions of the electronic device will extend. According to a further aspect of the present disclosure, the growth of the polycrystal region is performed starting from a seed of silicon oxide that extends in a recess. Use of silicon oxide as seed for growth enables processing at high temperatures (maximizing the process efficiency), while recession of the silicon oxide seed enables one to obtain good surface uniformity of the polycrystal region and of the monocrystalline region (absence of depressions caused by the different rate of growth of the polycrystal and of the monocrystal).

More in particular, with reference to FIG. 2, the semiconductor body 12 comprises a substrate 30 and an epitaxial layer 42 grown on top of the substrate 30 and having a thickness comprised between 3 and 10 μm, for example approximately 5-6 μm. An active-area region 15 extends in the semiconductor body 12 laterally with respect to the drain sinker 13. Formation of the active-area region 15 does not form the subject of the present disclosure; consequently, it will not be described in detail. In this context, the active area 15 includes a monocrystalline silicon region that houses one or more source regions 14 and one or more gate regions 16 of the electronic device 11, as well as channel regions in which, in use, a vertical conductive channel 18 is set up. In particular, the conductive channel 18 of the electronic device 11 of FIG. 2 forms a conductive path in the direction Z, between source regions 14 and a common drain region 22. The drain region 22 extends on a surface 12b of the semiconductor body 12 that is opposite, along Z, to a respective surface 12a where the source regions 14 extend.

According to one aspect of the present disclosure, the drain sinker 13 is an implanted and diffused region of dopant species that extends in the semiconductor body 12 in the direction Z and comprises a polycrystalline silicon region 24.

According to an embodiment of the present disclosure, the polycrystalline silicon region 24 has a main extension along Z and extends through a part of the total thickness of the semiconductor body 12. The polycrystalline silicon region 24 has the function of favoring and rendering uniform diffusion of the implanted dopant species that form, in part, the drain sinker 13.

A transition zone 26, which extends between the polycrystalline silicon region 24 and the monocrystalline silicon region in which the active area 15 is formed, has a not perfectly polycrystalline structure on account of the progressive adaptation of the crystallographic lattice from polycrystal to monocrystal. This transition zone 26 may be considered, in the context of manufacture of the electronic device 11, as an area of defectiveness in which it is preferable not to form the active area 15.

Formation of the transition zone 26 is a consequence of the manufacturing process, as illustrated in what follows. In the same way, since the manufacturing process according to the present disclosure envisages formation of the polycrystalline silicon region 24 starting from a seed of silicon oxide, a silicon oxide region 28 (having the function of seed for growth of the polycrystal) extends underneath the polycrystalline silicon region 24. The drain sinker 13 and, in particular, the polycrystalline silicon region 24, extend as far as the drain region 22 so that there is electrical contact between the drain region 22 and the (doped) polycrystalline silicon region 24.

There now follows a description of an embodiment of the drain sinker 13.

With reference to FIGS. 3-9, steps are illustrated for forming the drain sinker 13 of FIG. 2, according to an aspect of the present disclosure.

Figure 3:
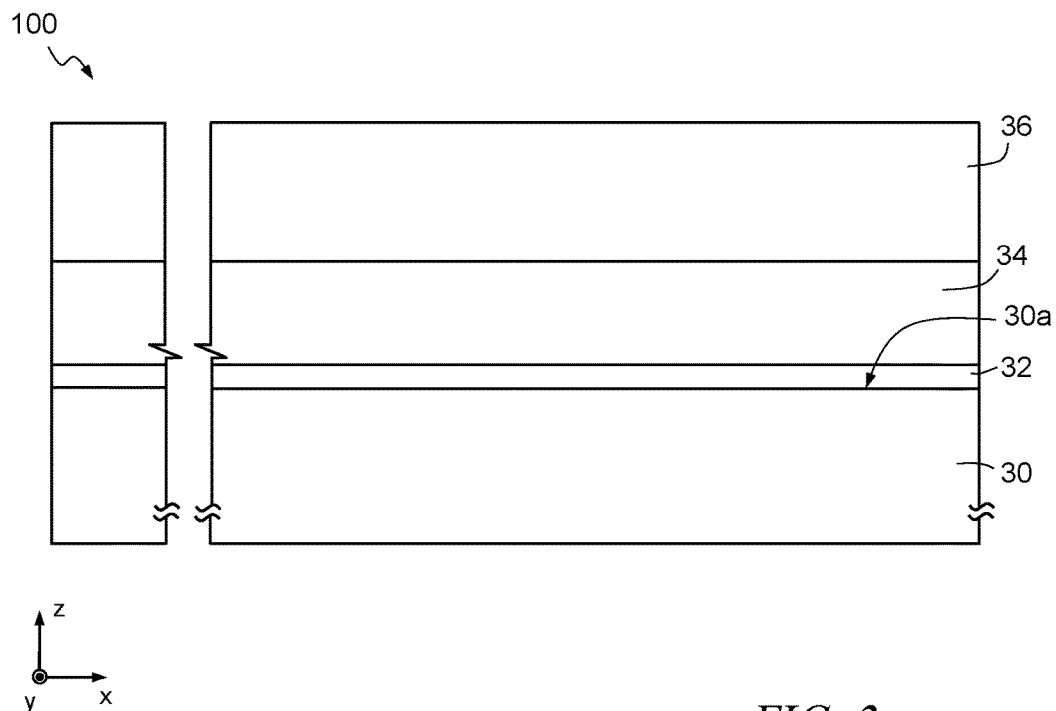
FIGS. 3-9 show, in lateral-sectional view, steps of a method of manufacturing the vertical conduction device of FIG. 2.
Figure 4:
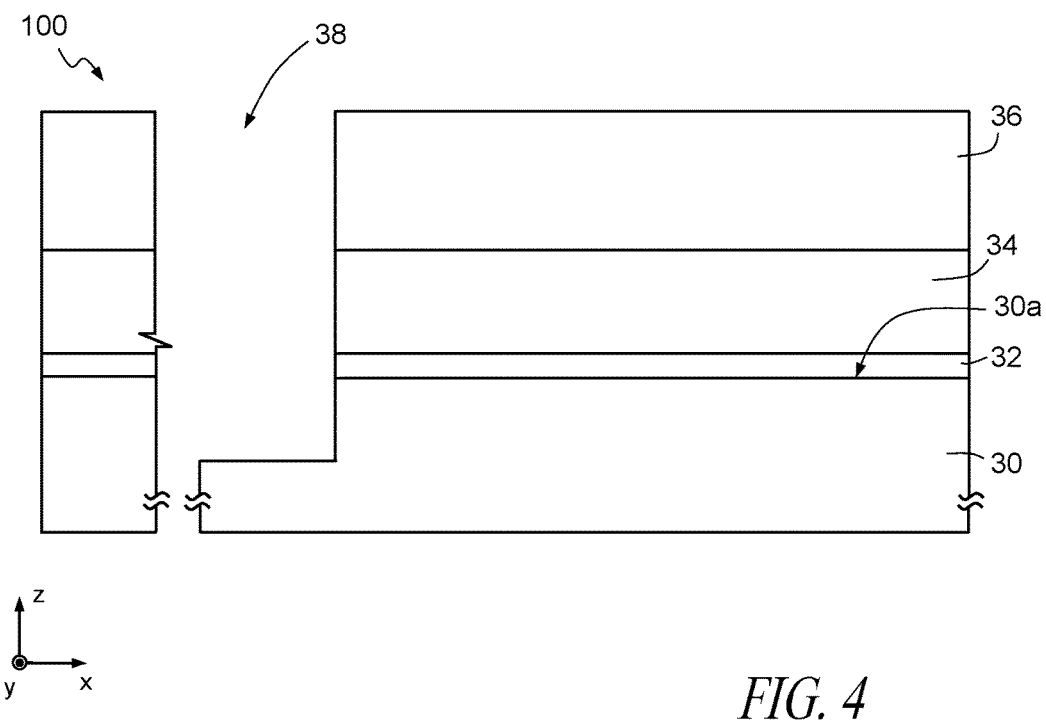
Figure 5:
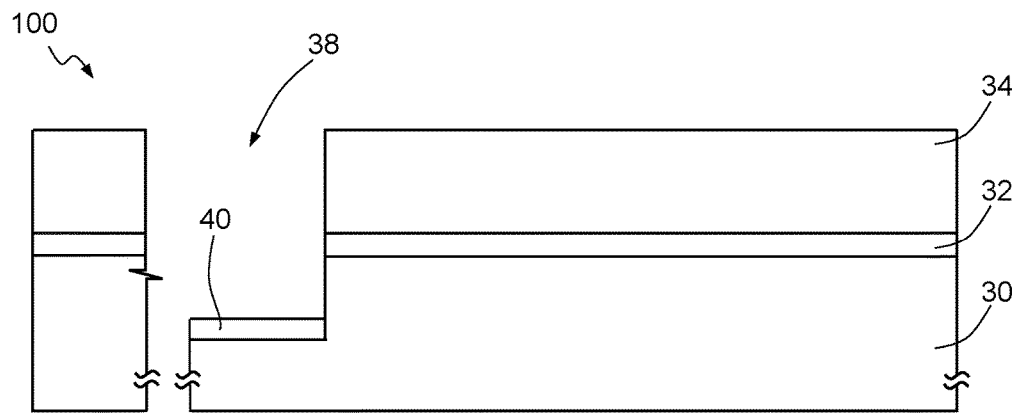
Figure 6:
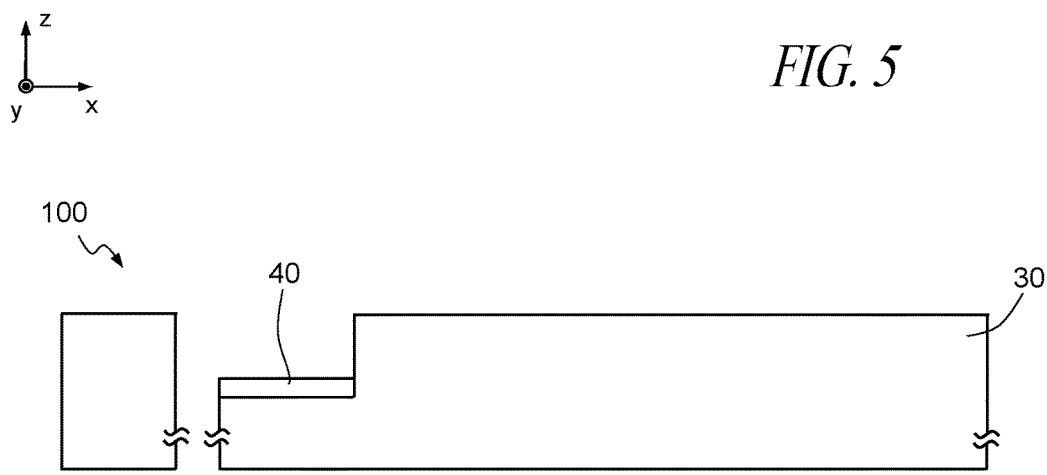
Figure 7:
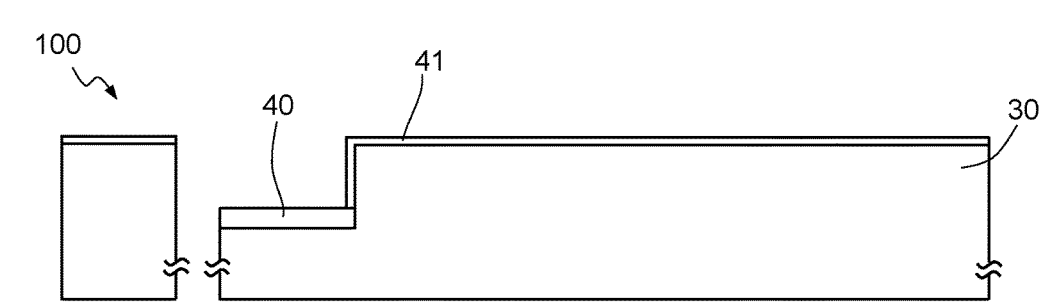

With reference to FIG. 3, a wafer 100 is provided including a semiconductor substrate 30, in particular of monocrystalline silicon, having a top surface 30a. The substrate 30, of silicon of a P type, is already prepared with a buried layer having an N+ doping. This buried layer forms the drain region 22. This aspect belongs, in a per se known manner, to the state of the art and is not discussed any further herein.

An interface layer 32 is formed on the top surface 30a of the substrate 30. The interface layer 32 is, in particular, of thermally grown silicon oxide and has a thickness of some nanometers, for example comprised between 10 and 15 nm, for example 13 nm. Thermal growth of this interface layer is performed, in one embodiment, in an environment at atmospheric pressure in the presence of oxygen, at a temperature of 800° C.

A mask layer 34 is then formed, for example of silicon nitride, with a thickness comprised between 100 and 150 nm, for example 120 nm. The mask layer 34 is deposited, for instance, in an environment at a pressure of 230 mTorr, at 750° C., in the presence of dichlorosilane (DCS) and ammonia ($NH_3$).

In this context, the interface layer 32 has the function of reducing the interface stress that would arise in the case of direct deposition of the mask layer 34 (SiN) on the substrate 30 (Si).

Further formed on the mask layer 34 is a photoresist layer 36, with a thickness comprised between 1 and 2 μm, for a subsequent step of definition of the wafer 100 by photolithography.

Then, FIG. 2, after photolithographic definition of the photoresist layer 36, one or more chemical-etching steps (e.g., RIE) are carried out to remove selective portions of the mask layer 34, of the interface layer 32, and of the substrate 30 in regions of the wafer 100 in which the drain sinker 13 of FIG. 2 is to be formed.

According to one embodiment, the mask layer 34, the interface layer 32, and, in part, the substrate 30 are removed so as to form a trench 38 having a circular or quadrangular shape, in view in the plane XY, with a diameter comprised between approximately 0.5 μm and 2 μm. The trench 38 terminates within the substrate 30 at a depth, measured along Z starting from the top surface 30a of the substrate 30, of one or more tens of nanometers, for example 50 nm.

Next (FIG. 5), the photoresist layer 36 is removed, and a step of thermal growth of silicon oxide ($SiO_2$) is carried out on the wafer 100. In particular, the silicon oxide grows within the trench 38, in exposed regions of the substrate 30. The growth of thermal oxide is carried out in an environment with water vapor, at approximately 1000° C., in order to form a seed layer 40 of silicon oxide, with a thickness comprised between approximately 60 and 100 nm.

Then (FIG. 6), the mask layer 34 and the interface layer 32 are removed from the wafer 100. This step may be carried out via wet etching, using $H_3PO_4$ to remove selectively the silicon nitride of the mask layer 34, and HF to remove the oxide of the interface layer 32. The HF etching step removes, in part, also the seed layer 40, thinning it out. The present applicant has found that a seed layer 40 having, after the step of etching of the interface layer 32, a thickness of some tens of nanometers (e.g., 30-100 nm) is adequate for the purposes of the present disclosure. The thickness of the seed layer 40 is not in any case a critical parameter.

In the case where a subsequent step of epitaxial growth is not carried out immediately after the manufacturing step (FIG. 6), a native oxide layer 41 is formed (FIG. 7), in a known way, on the substrate 30. In order to remove said native oxide layer, a step of thermal annealing is carried out in an environment with hydrogen ($H_2$). This step is carried out at a temperature of approximately 1100° C. for some seconds (e.g., 15-20 seconds) in order to remove the native oxide effectively, but not the seed layer 40. The present applicant has found that the aforementioned annealing step does not have a significant impact on the thickness of the seed layer 40.

Then (FIG. 8), a step of epitaxial growth on the wafer 100 is carried out. In particular, an epitaxial layer with an N doping is grown, in an environment at a temperature comprised between 1000 and 1200° C., for example 1125° C., with trichlorosilane and hydrogen. Phosphine ($PH_3$) in a concentration of approximately $2.5 \cdot 10^{16}$ cm$^{-3}$ is used as dopant gas.

Figure 8:
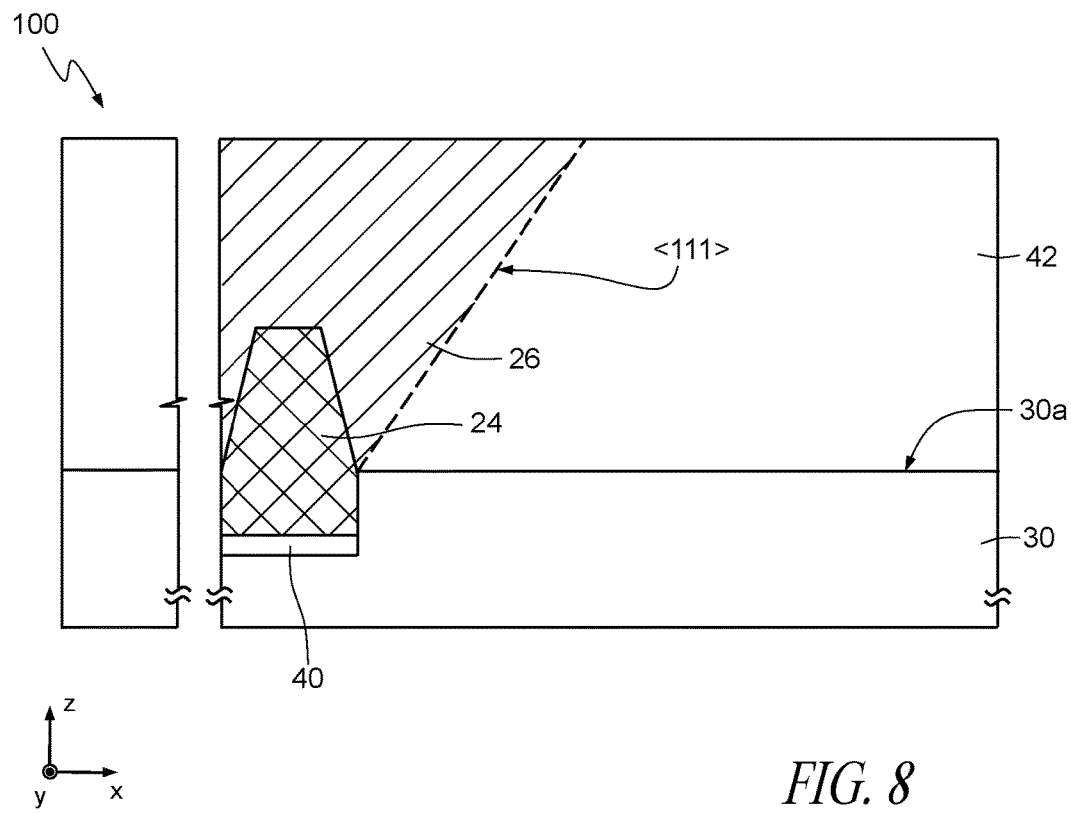
Figure 9:
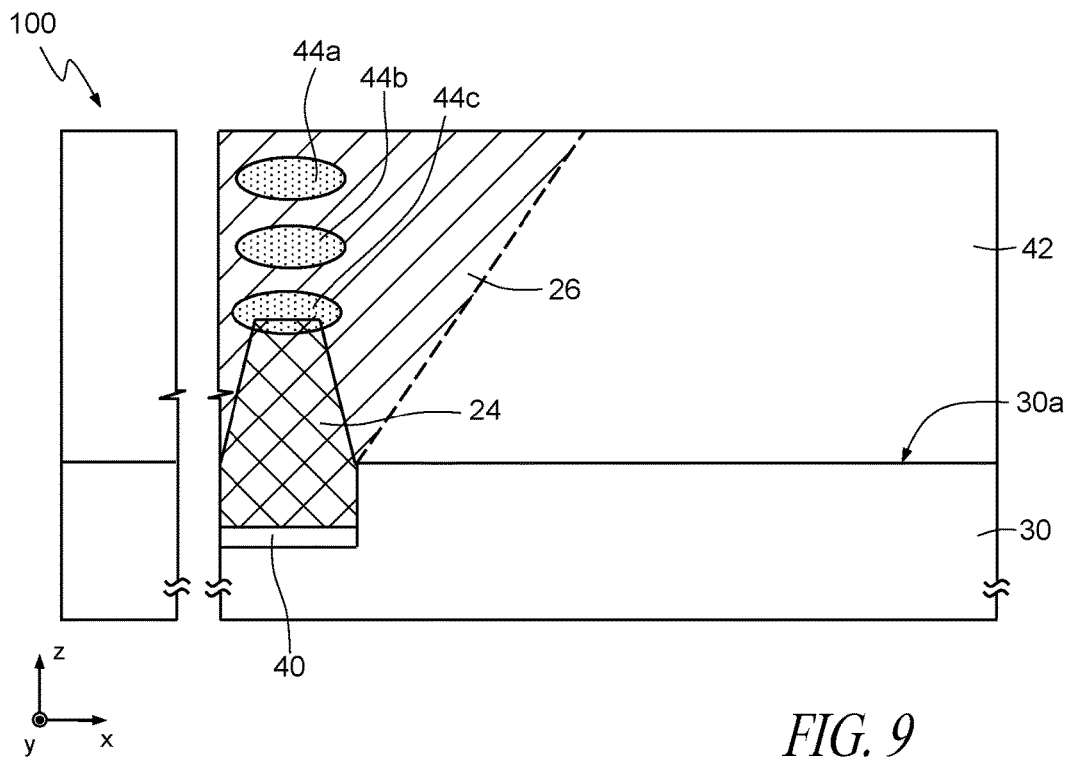

The growth in the seed layer 40 generates a column, tapered upwards, of polycrystalline silicon (the polycrystalline region 24); in particular, the polycrystalline region 24 has, in lateral-sectional view, a substantially trapezial shape, with a major side in the seed layer 40 and an opposite miner side. In other words, the fronts of growth of the polycrystalline region 24 tend to close as the thickness of the epitaxy increases. In the surface regions 30a of the substrate 30 (which, as has been said, are of monocrystalline silicon), there is noted the epitaxial growth of a monocrystalline epitaxial layer. The two fronts of growth (polycrystalline and monocrystalline) proceed with respective rates and generate the transition zone 26 that derives from the encounter between the two fronts of growth and from the consequent lattice adaptation. The transition zone 26 is consequently neither a perfectly monocrystalline area nor a perfectly polycrystalline area and, in the context of the present disclosure, is used and exploited during the step of implantation and diffusion of the dopant species that concur to form the drain sinker 13. The transition zone 26 has, in cross-sectional view, a substantially the shape of a trapezium turned upside down (FIG. 8 shows only half of the transition zone 26), i.e., having a minor side in the seed layer 40 and an opposite major side. The transition zone 26 is delimited laterally by the crystallographic plane <111>.

Considering a square seed layer 40 with a side, along X, of approximately 650 nm and a thickness, along Z, of approximately 50 nm, the present applicant has found that the epitaxial growth using the parameters referred to previously leads to formation of a polycrystalline silicon region 24 having an extension, along Z, of approximately 2-3 μm. The epitaxial growth is adjusted to form an epitaxial layer 42 having a thickness, along Z, comprised between approximately 5 μm and 6 μm (e.g., 5.8 μm).

In general, the thickness of the seed layer 40 does not have an impact on the extension along Z of the polycrystalline silicon region 24. Instead, the extension in the plane XY determines the maximum height thereof. Using a seed layer 40 with a diameter, in the plane XY, comprised between 1.5 μm and 2.5 μm, the extension along Z of the polycrystalline silicon region 24 is typically comprised between 1.5 μm and 2.5 μm; if an epitaxial layer having a thickness comprised between 5 and 6 μm is grown, no significant surface depressions are noted (the surface of the epitaxy is substantially planar).

The next step (FIG. 9) is implantation of dopant species in the polycrystalline silicon region 24. In other words, the implants are carried out in sequence so as to form a plurality of implanted regions 44a, 44b, 44c that extend at respective depths in the polycrystalline silicon region 24 and transition zone 26, aligned to one another and to the polycrystalline silicon region 24 in the direction Z.

The implants are, in one embodiment, of an N type (e.g., with implantation of phosphorus), at a dose of approximately $5 \cdot 10^{13}$ cm$^{-2}$ and respective implantation energies of approximately 300 keV (implanted region 44a), 1.5 MeV (implanted region 44b), and 3.2 MeV (implanted region 44c). Using the aforementioned parameters, the present applicant has found that the implanted region 44c extends at a depth in the semiconductor body 12 of approximately 3 μm. The implantation energy may in any case be regulated as a function of the thickness of the epitaxial layer 42 and of the extension along Z of the polycrystalline silicon region 24 so that at least the deepest implanted region (here, the region 44c) extends at least in part within the polycrystalline silicon region 24.

Next, a step of thermal annealing is carried out to favor diffusion of the dopant species implanted in the previous step. According to one embodiment, annealing is carried out for a time of 2 h, at a temperature of 1000° C.

The diffusion profile of the dopant species within the polycrystalline silicon region 24, as verified by the present applicant, shows a depth of diffusion of the dopant species in the polysilicon that is approximately three times what occurs in a monocrystalline region (of the type described with reference to FIG. 1). Likewise, also the diffusion profile of the dopant species within the transition zone 26 is better. Thus a sinker drain region 13 is obtained in which the distribution of the dopant species present a good uniformity throughout the thickness of the epitaxial layer.

Consequently, the drain sinker 13 is characterized by a resistivity lower than the drain sinker 8 of FIG. 1, given the same extension along Z.

The manufacturing method then proceeds with known steps of formation of the source region 14 and gate region 16 and with the formation of the field plate 6, as illustrated in FIG. 2. As has been said, it is preferable to form the source region 14 and the gate region 16 in the monocrystalline epitaxial layer 42, i.e., laterally with respect to the transition zone 26. The field-plate trench 6, instead, may be formed completely or in part within the transition zone 26 in so far as it does not participate actively in the electrical-conduction processes.

From an examination of the characteristics of the disclosure obtained according to the present disclosure, the advantages that it affords are evident.

In particular, the method according to the present disclosure enables high concentrations of dopant in the drain sinker and a diffusion depth of the dopant greater than in the known art. Similar advantages may be found in the device obtained according to the foregoing description. The value of ON-state resistance $R_{ON}$ of the device is thus reduced, with consequent improvement of the performance, lower power consumption, and less thermal dissipation.

Finally, it is clear that modifications and variations may be made to what has been described and illustrated herein, without thereby departing from the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A vertical conduction device, comprising:
a semiconductor body;
a first conduction terminal which extends at a first side of the semiconductor body;
a second conduction terminal which extends at a second side opposite to the first side of the semiconductor body;
a control terminal configured to be biased to generate a conductive channel between the first and second conduction terminals;
a silicon oxide seed layer within the semiconductor body;
a polycrystalline silicon region of the semiconductor body, the polycrystalline silicon region extending in contact with, and over the seed layer;
a monocrystalline silicon region of the semiconductor body, which surrounds the seed layer; and
an implanted region, which extends in the semiconductor body in said polycrystalline silicon region and forms a conductive path between the first side of the semiconductor body and the second conduction terminal.

2. The vertical conduction device according to claim 1, wherein:
the first conduction terminal is a source terminal, the second conduction terminal is a drain terminal, and the control terminal is a gate terminal of the device, and
said conductive path is a deep drain diffusion, or drain sinker, of the device.

3. The vertical conduction device according to claim 1, wherein the seed layer extends within the second conduction terminal.

4. The vertical conduction device according to claim 1, wherein the polycrystalline silicon region has a shape of a column tapered towards the first side.

5. The vertical conduction device according to claim 1, wherein the semiconductor body includes a transition zone extending between the polycrystalline silicon region and the monocrystalline silicon region, the transition zone being polycrystalline with crystalline structures corresponding to a crystalline structure of the monocrystalline silicon region.

6. The vertical conduction device according to claim 1, wherein the implanted region extends within the transition zone.

7. A vertical conduction device, comprising:
a semiconductor body having a first side and a second side opposite to the first side, the semiconductor body including:
a first conduction terminal positioned at the first side of the semiconductor body;
a second conduction terminal positioned at the second side of the semiconductor body;
a control terminal configured to generate a conductive channel between the first and second conduction terminals;
an oxide seed layer;
a polycrystalline semiconductor region of the semiconductor body, the polycrystalline silicon region extending in contact with, and over the seed layer;
a monocrystalline semiconductor region of the semiconductor body and adjacent to the seed layer, the control terminal and first and second conduction terminals being formed in the monocrystalline semiconductor region; and
an implanted region that extends in the polycrystalline semiconductor region and forms a conductive path between the first side of the semiconductor body and the second conduction terminal.

8. The vertical conduction device according to claim 7, wherein:
the first conduction terminal is a source terminal, the second conduction terminal is a drain terminal, and the control terminal is a gate terminal of the device, and
said conductive path is a deep drain diffusion, or drain sinker, of the device.

9. The vertical conduction device according to claim 7, wherein the oxide seed layer extends within the second conduction terminal.

10. The vertical conduction device according to claim 7, wherein the polycrystalline semiconductor region has a shape of a column tapered towards the first side.

11. The vertical conduction device according to claim 7, wherein:
the semiconductor body includes a transition zone extending between the polycrystalline semiconductor region and the monocrystalline semiconductor region, the transition zone being polycrystalline with crystalline structures corresponding to a crystalline structure of the monocrystalline semiconductor region; and
the implanted region extends within the transition zone.

12. A device, comprising:
a semiconductor substrate;
an oxide seed layer formed on or in the substrate;
a polycrystalline semiconductor region extending in contact with, and over the seed layer;
a monocrystalline semiconductor region positioned on the substrate;
a transition zone extending between the polycrystalline semiconductor region and the monocrystalline semiconductor region, the transition zone being polycrystalline with crystalline structures corresponding to a crystalline structure of the monocrystalline semiconductor region; and
an implanted region that extends in the polycrystalline semiconductor region and the transition zone, and forms a conductive path to the substrate.

13. The device according to claim 12, comprising a transistor that includes:
a first conduction region extending into the monocrystalline semiconductor region from a first side of the monocrystalline semiconductor region;
a second conduction region extending in the substrate;
a control region configured to generate a conductive channel extending from the first conduction region through the monocrystalline semiconductor region and the second conduction region to the implanted region.

14. The device according to claim 13, wherein:
the first conduction region is a source region, the second conduction region is a drain region, and the control region is a gate region of the transistor, and
said conductive path is a deep drain diffusion, or drain sinker, of the transistor.

15. The device according to claim 13, wherein the oxide seed layer is positioned within the second conduction terminal.

16. The device according to claim 12, wherein the polycrystalline semiconductor region has a shape of a column tapered away from the oxide seed layer.

* * * * *